(12) United States Patent
Kobayashi

(10) Patent No.: US 6,544,894 B1
(45) Date of Patent: *Apr. 8, 2003

(54) METHOD OF PRODUCING CHROMIUM MASK

(75) Inventor: Shinji Kobayashi, Nara (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/459,642

(22) Filed: Dec. 13, 1999

(30) Foreign Application Priority Data

Jan. 26, 1999 (JP) .............................. 11-017302

(51) Int. Cl.⁷ .................. H01L 21/302; H01L 21/3065; H01L 21/308; C23F 1/00
(52) U.S. Cl. ...................... 438/706; 438/720; 438/725; 216/41
(58) Field of Search ................. 438/706, 720, 438/725; 216/41

(56) References Cited

U.S. PATENT DOCUMENTS

| 4,534,816 A | * | 8/1985 | Chen et al. ................. 156/345 |
| 5,158,897 A | * | 10/1992 | Sato et al. ................... 438/515 |
| 5,183,775 A | * | 2/1993 | Levy ............................ 438/366 |
| 5,246,799 A | * | 9/1993 | Pierrat ............................ 430/4 |
| 5,442,185 A | * | 8/1995 | Chan ..................... 250/492.21 |
| 5,474,589 A | * | 12/1995 | Ohga et al. ..................... 65/397 |
| 5,698,035 A | * | 12/1997 | Matsudo et al. .......... 118/723 E |
| 5,783,366 A | * | 7/1998 | Chen et al. .................. 430/311 |
| 5,877,032 A | * | 3/1999 | Guinn et al. ..................... 438/9 |

FOREIGN PATENT DOCUMENTS

| GB | 680306 A1 | * 12/1988 | ........... B11B/5/255 |
| JP | 51-90274 | 8/1976 | |
| JP | 60219748 A | * 11/1985 | ................. 438/706 |
| JP | 62-37932 | 2/1987 | |
| JP | 1-288853 | 11/1989 | |
| JP | 3-271739 | 12/1991 | |
| JP | 5(1993)-267255 | 10/1993 | |
| JP | 6-230557 | 8/1994 | |
| JP | 9246246 A | * 9/1997 | ........ H01I/21/3065 |

OTHER PUBLICATIONS

Tanaka et al., Pattern Formation by Dry Etching, Nov. 11, 1985, English Abstract of JP 60219748, 1 page.*
Tani, Dry Etching and Manufacture of Semiconductor Device, Sep. 19, 1997, English Abstract of JP 9246246 A, 2 pages.*

* cited by examiner

Primary Examiner—Robert Kunemund
Assistant Examiner—Lynette T. Umez-Eronini
(74) Attorney, Agent, or Firm—Nixon & Vanderhye P.C.

(57) ABSTRACT

A method of producing a chromium mask, said method comprising forming a chromium film on a mask substrate, forming a resist layer on the chromium film, patterning the resist layer in desired shape, performing plasma treatment with a fluorine-containing gas on the resist pattern, and finally performing dry etching on the chromium film by using the resist pattern as a mask.

12 Claims, 6 Drawing Sheets

(peripheral part)　　　(central part)
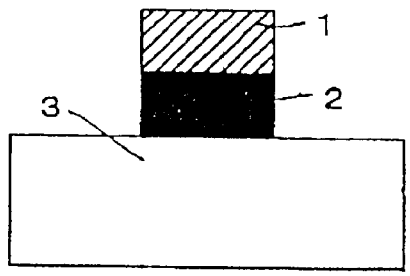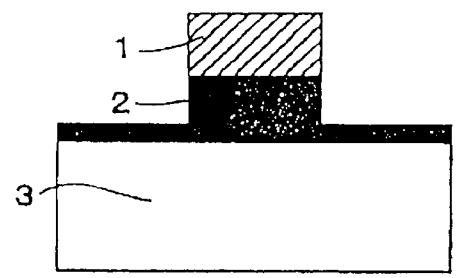
Fig.6(a)
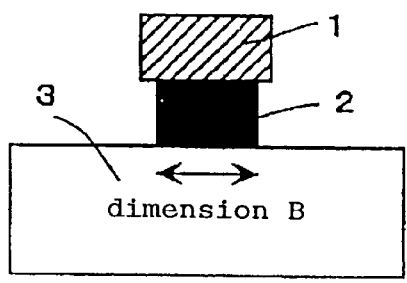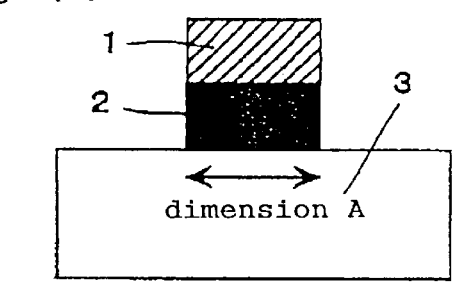
Fig.6(b)
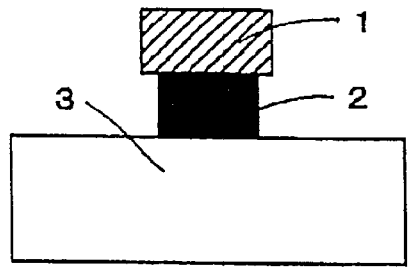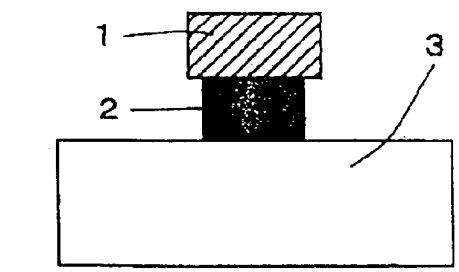
Fig.6(c)
Fig.7
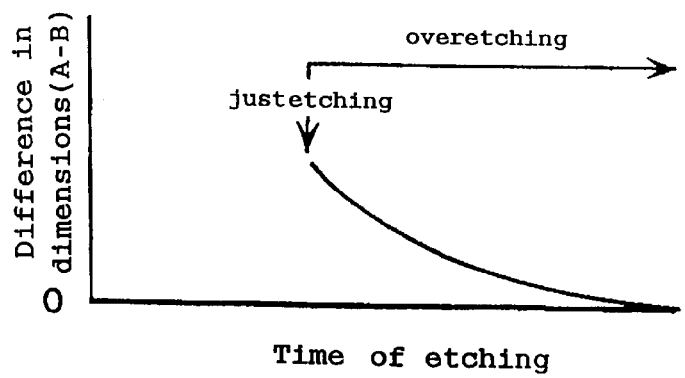

METHOD OF PRODUCING CHROMIUM MASK

CROSS-REFERENCE TO RELATED APPLICATION

This application is related to Japanese application No. HEI11(1999)-17302 filed on Jan. 26, 1999, whose priority is claimed under 35 USC §119, the disclosure of which is incorporated by reference in its entirety.

BACKGROUND OF THE INVENTION

1. Field of the Invention

The present invention relates to a method of producing a chromium mask. More particularly, the present invention relates to a method of producing a chromium mask by forming a chromium film on a mask substrate and subsequently performing dry etching for patterning on the chromium film by using a patterned resist film as a mask.

2. Description of the Related Arts

In photolithography for semiconductor production, it has been a common practice to use a chromium mask as a light shield which is a chromium film in specific shape (pattern) formed on a quartz substrate.

The patterning of a chromium film is usually divided roughly into a photolithographing process, comprising forming a quartz substrate with a chromium film, coating the chromium film with a resist film, and forming a resist pattern by pattering the resist film with an electron beam (hereinafter referred to as EB), and an etching process comprising patterning the resist pattern by using.

In particular, the etching of a chromium film is dominated by wet etching, and chromium masks are produced mainly by this process. This is in contrast to the fact that dry etching has long been investigated and adopted in the production of wafers for industrial production. As causes for this may be mentioned the following two points.

First, chromium masks do not need microfabrication so much. In other words, microfabrication by photolithography is undergone with a reduction projection exposure system (hereinafter referred to as stepper) in wafer process, whereas chromium masks, which are 5 to 10 times larger than wafer process, are patterned without requiring such microfabrication technology.

Second, wet etching, which is isotropic etching, has an inherent disadvantage of causing undercutting, which leads to fluctuation in pattern dimensions with fluctuation of thickness of films to be etched. To avoid this trouble, dry etching has been employed for wafer process. On the other hand, these problems are not serious in mask process because the mask substrate is free of steps which pose a problem in wafer processing and the film to be etched is uniform in thickness.

In the meantime, the importance and necessity of dry etching have been gradually recognized in the high-technology field.

The first reason for this is the progress in photolithography which has replaced the conventional stepper system by the new scanner system. All currently available commercial apparatus for the scanner system have a projection ratio of 4 so as to achieve finer patterning required of chromium masks.

The second reason is the increasing demand for proximity correction masks, which has occurred in pursuit of microfabrication of wafer process in which the dimensions of fabrication is smaller than the wavelength of exposing light. In other words, in photolithography for patterning with dimensions smaller than the wavelength of exposing light, it is necessary to accurately control the intensity of light or the amount of light passing through the opening and the diffraction of light. This control is accomplished by the proximity effect correcting mask with accurate fine patterns which do not form images on the wafer. Thus, by far higher resolution and finer patterning are necessary.

The third reason is the necessity for completely eliminating dusts and foreign matters from the chromium mask. Images of dusts and foreign matters are transferred to the wafer during processing.

As mentioned above, the advantage of dry etching is an improvement in patterned shape (edge roughness and cross section) and in resolution of fine patterns.

At present, dry etching for chromium masks employs a mixed gas of oxygen and chlorine or dichloromethane. The rate of etching varies depending on the area to be etched, and minimizing such variation is important for accurate, uniform patterning of chromium masks.

Dry etching is usually subject to variation in etching rate due to the area effect as shown in FIG. 5. It is to be noted that there are less chlorine ions per unit area for etching in the central part thereof the chromium film than in the peripheral part on the mask substrate. Thus the etching rate varies from the central part to the peripheral part and hence the resulting chromium mask pattern varies in dimensions.

One way to tackle this problem is to overetching the chromium mask as explained below.

As shown in FIG. 6(a), first, a chromium film 2 is formed on the mask substrate 3 and a resist pattern 1 is subsequently formed on the chromium film 2. The chromium film 2 undergoes etching through the resist pattern as a mask. Etching proceeds faster at its peripheral part than at its central part due to difference in etching rate, as shown in FIG. 6(a).

As etching proceeds further, the chromium film 2 at the central part where the etching rate is smaller is completely etched, as shown in FIG. 6(b). At the same time, side etching occurs in the chromium film 2 at the peripheral part. Thus the pattern dimension B at the peripheral part becomes smaller than the pattern dimension A at the central part.

As etching proceeds further, the chromium film 2 at the peripheral part becomes less subject to side etching by the shielding effect of the resist pattern 1, while the chromium film 2 at the central part remains subject to side etching, as shown in FIG. 6(c). As the result, the difference between dimension A and dimension B becomes gradually smaller, see FIG. 7.

In order to reduce the difference in dimensions in this way, it is necessary to carry out the above treatment while keeping a right resist selectivity. In other words, with a low resist selectivity, it is impossible to reduce the difference in dimensions by overetching and reduce the total etching shift, as shown in FIG. 8.

To compensate for etching shift and thereby to eventually obtain an etched chromium pattern of desired dimensions, it is necessary to form in the preceding step the resist pattern whose pattern dimension is lager by an amount corresponding to etching shift in other words, space dimension is smaller by corresponding to etching shift. This means that a higher resolution is required to form the resist pattern. In the case of patterning a positive-type resist by means of an EB exposure system at a comparatively low accelerating voltage (10 kV), dimensions vary depending on the amount of line shift as shown in FIGS. 9 and 10. For an isolated pattern, dimensional linearity remains almost constant over the entire range from 0.5 μm to 2.5 μm, as shown in FIG. 9, whereas for a line-and-space (1:1) pattern, dimensional linearity remains almost constant only over the limited range from 1.0 μm to 2.5 μm, as shown in FIG. 10. In other words, in the case of a line-and-space pattern, the dimensional linearity depends only on the space width. Consequently, as wide a space as possible is important in patterning so as to ensure the dimensional linearity and to form a high-precision resist pattern. In addition, with a small amount of etching shift, it is possible to form a high-precision chromium pattern without the necessity to use spaces narrower than necessary.

As mentioned above, in the dry etching of a chromium mask for LSI production, overetching is necessary to adjust the patterned dimensions at the central and peripheral parts. Unfortunately, the present resolution is not high enough to cope with a large amount of etching shift. Thus, there is a demand for a means to minimize the amount of etching shift due to overetching.

In this connection, there has been proposed a method of improving the resist selectivity (or reducing the amount of etching shift) by phosphorus ion implantation into the resist by means of an ion beam apparatus, in Japanese Unexamined Patent Publication No. HEI5(1993)-267255.

Unfortunately, this method needs an additional apparatus which makes the process more complex and increases the probability of mask defects occurring (i.e. decreases the mark fabricating yields). Moreover, this method does not achieve a significant improvement in resist selectivity.

SUMMARY OF THE INVENTION

According to the present invention, it is to provided a method of producing a chromium mask comprising forming a chromium film on a mask substrate, forming a resist layer on the chromium film, patterning the resist layer in desired shape, performing plasma treatment with a flurine-containing gas on the resist pattern, and finally performing dry etching on the chromium film by using the resist pattern as a mask.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 6(a) to FIG. 6(c) are schematic diagrams illustrating the etching procedure which varies in etching rate depending on the position in the mark substrate.

FIG. 7 is a diagram showing that the difference in dimensions is reduced by overetching.

DESCRIPTION OF THE PREFERRED EMBODIMENTS

Figure 1A:
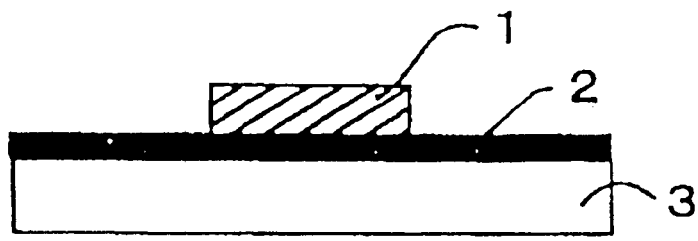
FIG. 1(a) to FIG. 1(c) are schematic sectional views of main parts illustrating one method of producing a chromium mask according to the present invention.

According to the present invention, the method of producing a chromium mask starts with forming a chromium film on a mask substrate. On the chromium film is formed a resist pattern of desired shape.

The mask substrate to be used in the present invention is not specifically restricted so long as it transmits light for exposure in photolithography. It includes, for example, a quartz substrate. The substrate may vary in thickness depending on material, and a typical thickness is usually more than 0.25 inches.

On the entire surface of the mask substrate is formed a chromium film by any known method, such as sputtering, vapor deposition, and EB vapor deposition. The chromium film is not specifically restricted in thickness so long as it completely shields light for exposure in photolithography, and a typical thickness is about 60–100 nm.

Subsequently, on the entire surface of the chromium film is formed a resist layer. The thickness of the resist layer is about 150–500 nm thick. The resist layer is patterned by photolithography and etching to give a resist pattern of desired shape. The resist layer may be either of positive type or negative type, such as ZEP810S and ZEP7000 (from Nippon Zeon Co., Ltd.). The resist layer may be formed by any known method such as spin coating and doctor blade coating. The patterning of the resist layer may be accomplished by lithography and etching which are known well in the arts. The dimensions of the pattern preferably correspond approximately to those of the chromium pattern as they determine the line width of the patterned chromium mask.

According to the present invention, the resist layer formed as mentioned above undergoes plasma treatment with a fluorine-containing gas, such as $CF_4$, $CHF_3$, and $C_2F_6$, used alone or in combination with one another. The plasma treatment should preferably be carried out in the same apparatus as is used for the subsequent step of dry etching for the chromium film. In this way it is possible to carry out the two steps continuously without exposing the work to the atmosphere and it is also possible to simplify the process for improvement in efficiency, while keeping the work clean during etching. The conditions of plasma treatment should be properly adjusted according to the kind of the fluorine-containing gas and the thickness of the resist pattern to be formed and so on. Typical conditions are as follows.

Gas(fluorine-containing gas) flow rate: about 90 to 110 sccm
RF power: about 50 to 150 W
Pressure: about 1.5 to 7 Pa
Time: about 10 to 40 seconds The thus obtained resist pattern is used as a mask when the chromium film undergoes dry etching, such as reactive ion etching (RIE).

Typical conditions of dry etching by magnetron RIE are as follows.

Gas flow rate: $Cl_2:O_2$=about 80:20 sccm
Pressure: about 7 Pa
RF power: about 80 W
MG: about 60 Gauss
Time: about 15 minutes Typical conditions of dry etching by normal RIE are as follows.

Gas flow rate: $CH_2Cl_2:O_2$=about 25:75 sccm
Pressure: about 33 Pa
RF power: about 200 W
MG: 0 Gauss
Time: about 5 minutes The etching gases may be used chlorine containing gases such as $Cl_2$ and $CH_2Cl_2$. These gases may be used alone or in combination with one another.

The method of producing a chromium mask according to the present invention is embodied as explained below with reference to the accompanying drawings.

The entire surface of a quartz mask substrate 3 of about 0.25 inch thick is entirely coated with a chromium film 2 of about 60 to 110 nm thick by sputtering, as shown in FIG. 1(a). On the entire surface of the chromium film 2 is formed a resist layer of about 150 to 500 nm thick, which is subsequently made into a resist pattern 1 of desired shape by EB lithography. The resist pattern 1 undergoes heat treatment (post baking) in the air at about 100 to 130° C. for about 15 minutes.

Figure 1B:
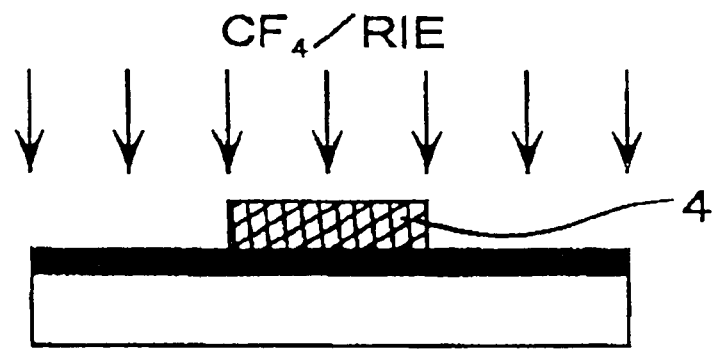

The thus obtained resist pattern 1 undergoes plasma treatment with $CF_4$ by means of a reactive ion etching (RIE) apparatus under the following conditions, as shown in FIG. 1(b).

Flow rate of $CF_4$ gas: 100 sccm
FR power: 100 W
Pressure: 2 Pa
Time of discharge: 10 to 20 seconds This plasma treatment causes ionized fluorine ions to be implanted into the resist pattern 4 so that the resist selectivity improves.

Figure 2:
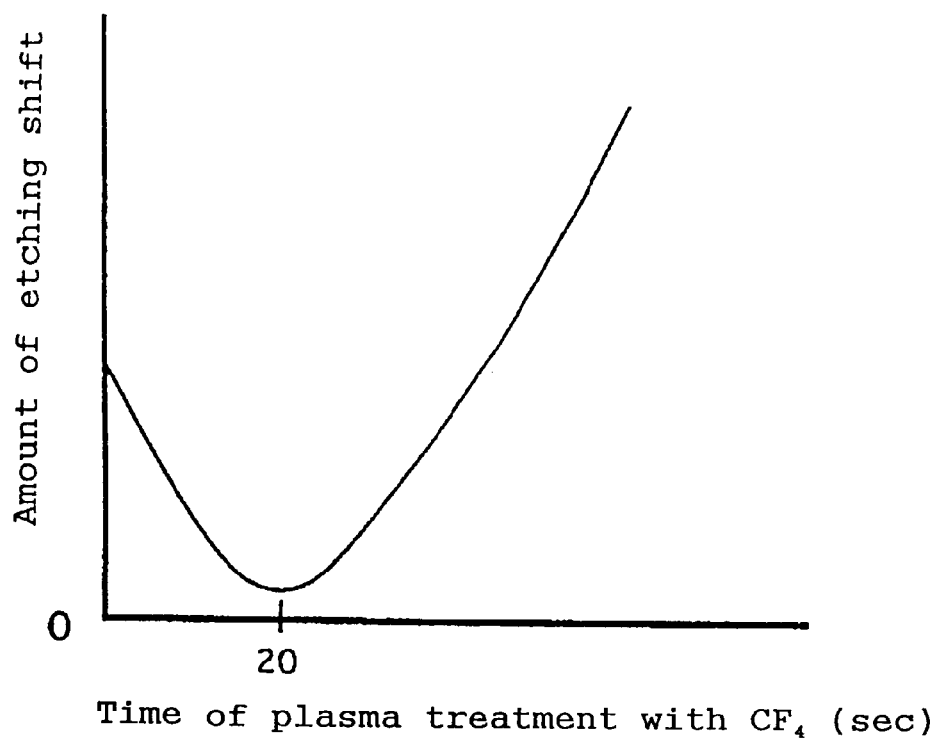
FIG. 2 is a graph showing the relation between the time of plasma treatment with $CF_4$ and the amount of etching shift.
Figure 3:
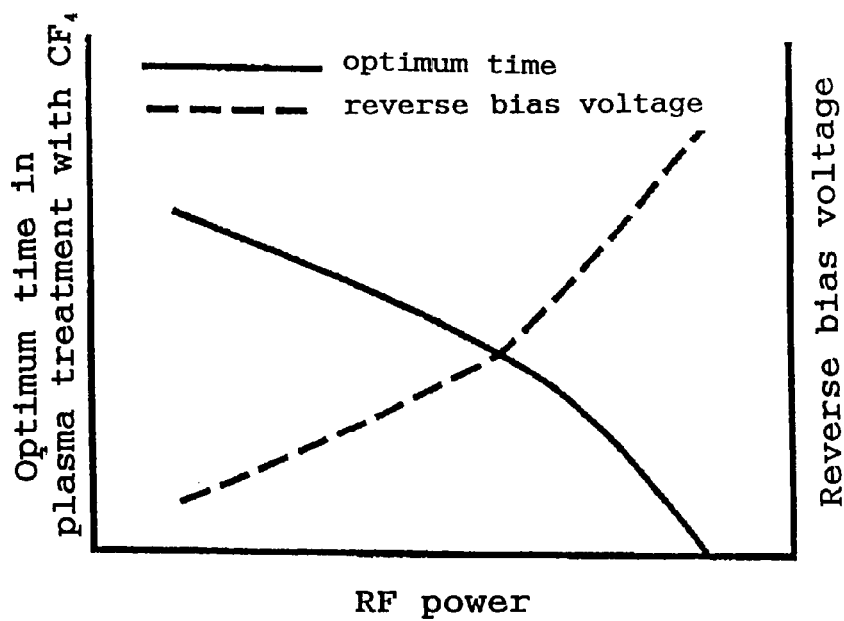
FIG. 3 is a graph showing the relation between the RF power and the optimum time or the reverse bias voltage in plasma treatment with $CF_4$.
Figure 4:
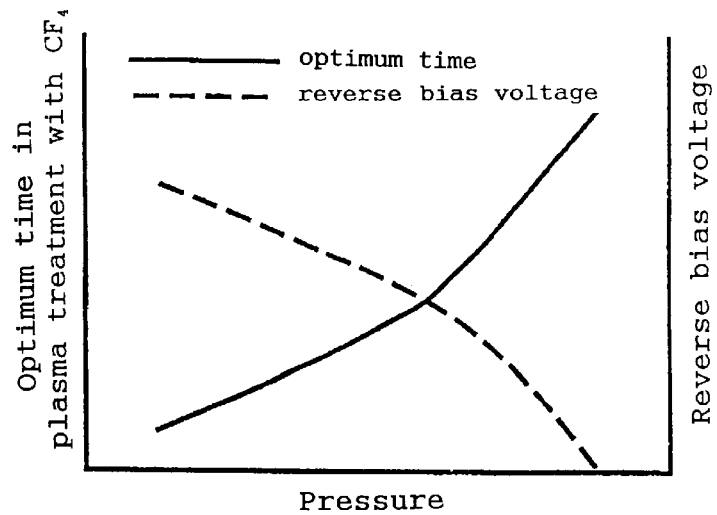
FIG. 4 is a graph showing the relation between the pressure and the optimum time or the reverse bias voltage in plasma treatment with $CF_4$.
Figure 5:
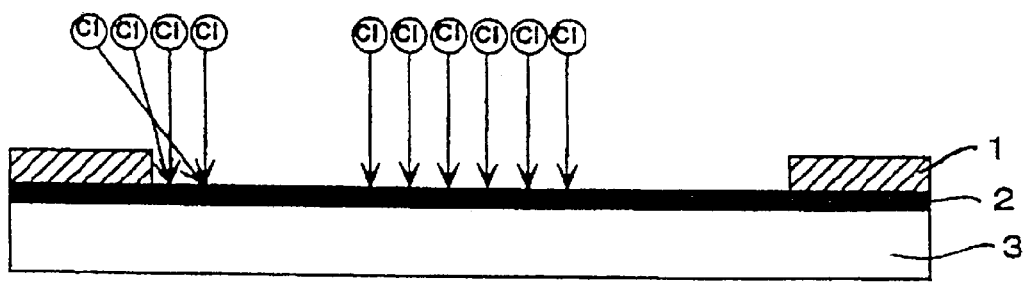
FIG. 5 is a schematic diagram illustrating the rate of etching which differs from the central part to the peripheral part in surface of the mark substrate (of chip area).
Figure 8:
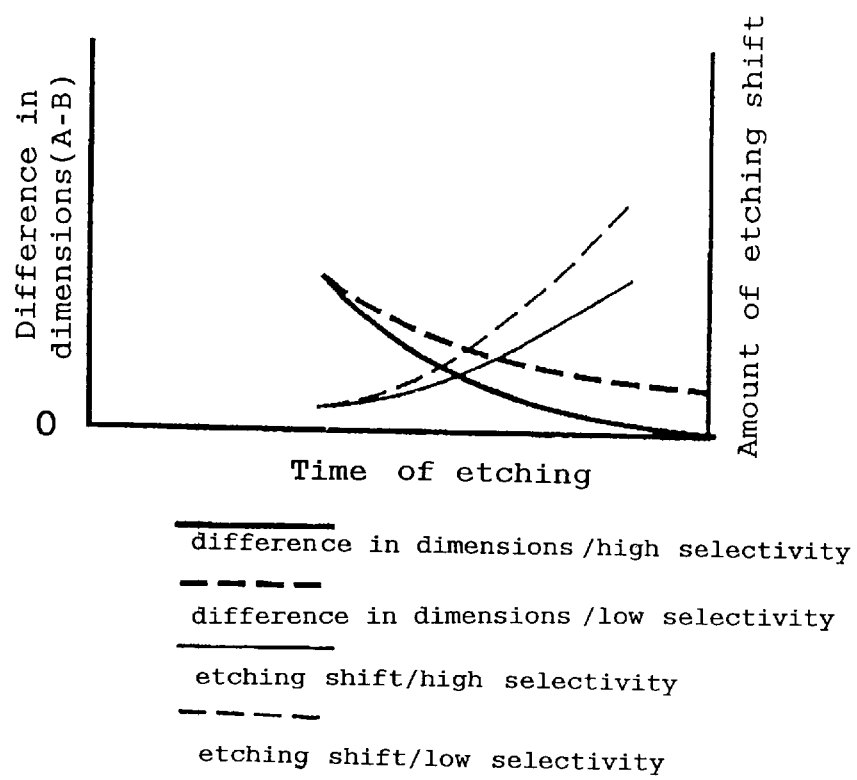
FIG. 8 is a graph showing the relation between the time of etching and the difference in dimensions or the amount of etching shift, with the resist selectivity being high or low.
Figure 9:
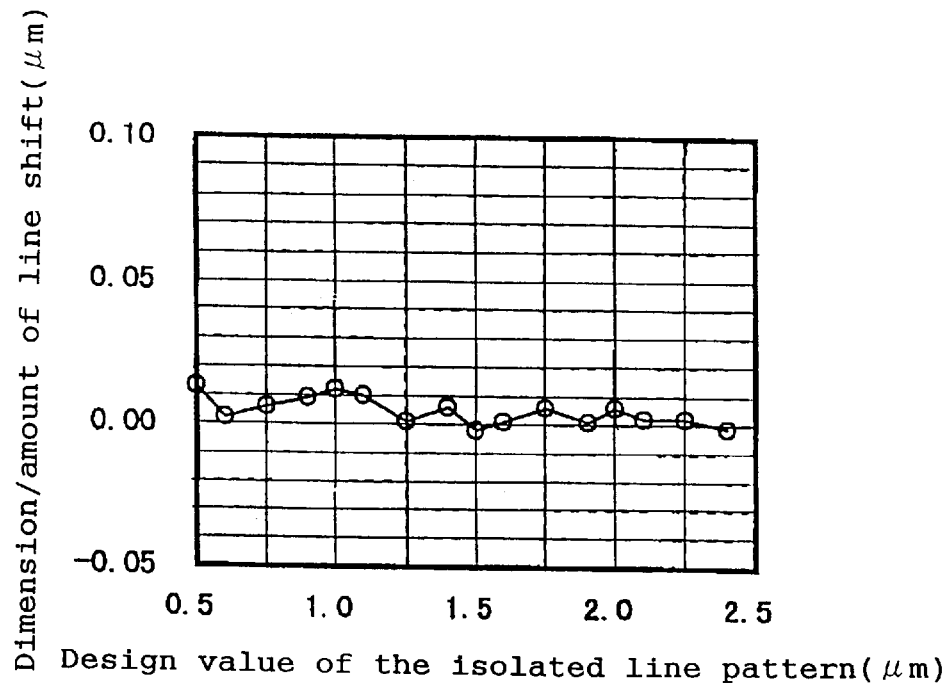
FIG. 9 is a graph showing how the dimensional linearity of the isolated line pattern varies.
Figure 10:
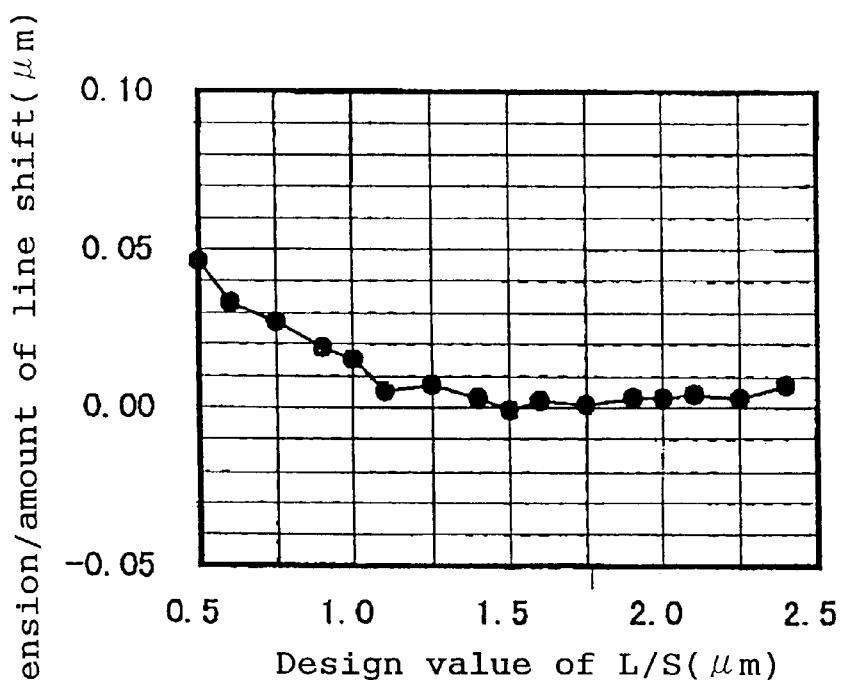
FIG. 10 is a graph showing how the dimensional linearity of the line-and-space (1:1) pattern varies.

The plasma treatment should be limited in time because it reduces the thickness of the resist pattern 1 by its sputtering nature which is sputtered the resist pattern by fluorine ions. The thinned resist pattern leads to an increased etching shift in the subsequent etching of the chromium film. The results of plasma treatment performed on the resist pattern 1 under the above-mentioned conditions indicate that the total amount of etching shift is minimal when the time of treatment is about 20 seconds, as shown in FIG. 2. The optimal time is closely related with other parameters and hence it varies depending on them. For example, if plasma treatment with $CF_4$ is carried out with the RF power kept high as shown in FIG. 3 or with the pressure kept low as shown in FIG. 4, the reverse bias voltage for plasma discharge increases and the incident energy of fluorine ions increases. As the result, the rate of implantation of fluorine ions into the resist pattern increases and the sputtering of the resist also increases. Thus the optimal time of treatment with $CF_4$ discharge is reduced.

Figure 1C:
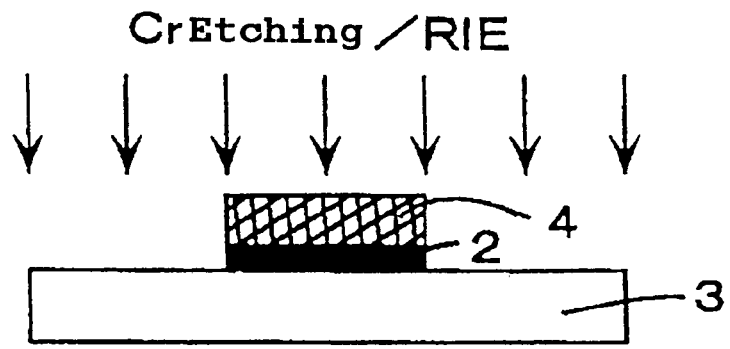

The RIE apparatus used for the foregoing steps is sufficiently evacuated, as shown in FIG. 1(c). The chromium film 2 is patterned by dry etching through the resist pattern 4 as a mask. The conditions of dry etching are as follows.

Gas flow rate: $Cl_2:O_2$=about 80:20 sccm
Pressure: about 7 Pa
RF power: about 80 W
MG: about 60 Gauss
Time: about 15 minutes In this way the chromium film 2 undergoes dry etching with a small amount of etching shift. Thus it is possible to produce a high-precision chromium mask. In addition, the above-mentioned method permits continuous operation in the same unit and the same chamber, which contributes to high productivity and simplifies the dust-free etching process.

According to the present invention, the resist pattern undergoes plasma treatment with a fluorine-containing gas, so as to improve the resist selectivity when the chromium film undergoes dry etching. This leads to a large reduction in the amount of etching shift. Thus it is possible to alleviate the necessity for microfabrication in the step of lithography which precedes the resist patterning. Consequently, the dimensional accuracy of the chromium mask pattern throughout the entire steps from the resist patterning to the chromium mask patterning is greatly improved.

According to the present invention, it is possible to carry out plasma treatment with a fluorine-containing gas on the resist pattern and dry etching on the chromium film continuously in the same apparatus without exposing the work to the atmosphere. This leads to an efficient simplified dust-free etching process, with a reduced rate of defects and a high manufacturing yield.

What is claimed is:

1. A method of producing a chromium mask, said method comprising:

forming a chromium film on a mask substrate, forming a resist layer on the chromium film, patterning the resist layer in a desired shape, performing plasma treatment with a fluorine-containing gas on the resist pattern in an apparatus, before etching the chromium film, in a manner so as to implant fluorine ions into the resist pattern, and thereafter, in the same apparatus, performing dry etching on the chromium film by using the plasma treated resist pattern as a mask, so that the plasma treatment is carried out in the same apparatus as is used for the dry etching of the chromium film.

2. A method as defined in claim 1, wherein the plasma treatment with a fluorine-containing gas on the resist pattern and the dry etching on the chromium film are carried out continuously in the same apparatus without the work being exposed to the atmosphere.

3. A method as defined in claim 1, wherein the plasma treatment with a fluorine-containing gas employs $CF_4$ gas and the dry etching of the chromium film employs a chlorine-containing gas.

4. A method as defined in claim 1, wherein the chromium film is 60 to 100 nm thick.

5. A method as defined in claim 1, wherein the plasma treatment is carried out under the conditions; 90 to 110 sccm of the flow rate of fluorine-containing gas, 50 to 150 W of the RF power, 1.5 to 7 Pa of the pressure, and 10 to 40 seconds of the time of treatment.

6. A method as defined in claim 1, wherein the dry etching is magnetron reactive ion etching.

7. A method as defined in claim 1, wherein the dry etching employs an etching gas composed of $O_2$ and $Cl_2$ or $CH_2Cl_2$.

8. A method of making a chromium mask, said method comprising:

forming a chromium film on a mask substrate;

forming a resist layer on the substrate over the chromium film;

plasma treating the resist layer using fluorine gas prior to etching the chromium film in order to implant fluorine ions into the resist pattern and improve etching resistance of the resist layer; and thereafter dry etching the chromium film using the plasma treated resist layer as a mask such that the plasma treating is carried out in the same chamber as is used for the dry etching of the chromium film.

9. A method of producing a chromium mask, said method comprising:

forming a chromium film on a mask substrate, forming a resist layer on the chromium film, patterning the resist layer in a desired shape, performing plasma treatment with a fluorine-containing gas on the resist pattern before etching the chromium film in a manner so as to implant fluorine ions into the resist pattern, the plasma treatment being carried out under the following conditions: 90–110 sccm flow rate of the fluorine containing gas, 50–150 W of RF power, 1.5–7 Pa pressure, and 10–40 seconds of plasma treatment time, and after the plasma treatment, performing dry etching on the chromium film by using the plasma treated resist pattern as a mask.

10. The method of claim 9, wherein the plasma treatment is carried out in the same apparatus as is used for the dry etching of the chromium film.

11. A method of making a mask comprising chromium, said method comprising:

forming a film comprising chromium on a mask substrate;

forming a resist layer on the substrate over the film;

plasma treating the resist layer using a gas comprising fluorine prior to etching the film in order to improve etching resistance of the resist layer, the plasma treating being performed in a manner so as to implant fluorine ions into the resist pattern, the plasma treating being carried out under the following conditions: 90–110 sccm flow rate of the gas comprising fluorine, 50–150 W of RF power, 1.5–7 Pa pressure, and 10–40 seconds of plasma treating time, and thereafter dry etching the film comprising chromium using the plasma treated resist layer as a mask.

12. The method of claim 11, wherein the plasma treating is carried out in the same apparatus as is used for the dry etching of the film.

* * * * *